(12) United States Patent
Chae

(10) Patent No.: US 10,566,074 B2
(45) Date of Patent: Feb. 18, 2020

(54) TEST MODE CONTROL CIRCUIT

(71) Applicant: SK hynix Inc., Icheon-si, Gyeonggi-do (KR)

(72) Inventor: Haeng Seon Chae, Yongin-si (KR)

(73) Assignee: SK hynix Inc., Icheon-si, Gyeonggi-do (KR)

(*) Notice: Subject to any disclaimer, the term of this patent is extended or adjusted under 35 U.S.C. 154(b) by 50 days.

(21) Appl. No.: 15/976,607

(22) Filed: May 10, 2018

(65) Prior Publication Data

US 2018/0259575 A1 Sep. 13, 2018

Related U.S. Application Data

(62) Division of application No. 15/133,013, filed on Apr. 19, 2016, now Pat. No. 10,002,677.

(30) Foreign Application Priority Data

Dec. 24, 2015 (KR) .......................... 10-2015-0185935

(51) Int. Cl.

| | |
|---|---|
| *G11C 29/46* | (2006.01) |
| *G01R 31/317* | (2006.01) |
| *G11C 29/12* | (2006.01) |
| *G11C 29/14* | (2006.01) |
| *G01R 31/3177* | (2006.01) |
| *G11C 29/00* | (2006.01) |
| *G11C 29/56* | (2006.01) |

(52) U.S. Cl.
CPC .......... *G11C 29/46* (2013.01); *G01R 31/3177* (2013.01); *G01R 31/31701* (2013.01); *G01R 31/31723* (2013.01); *G11C 29/00* (2013.01); *G11C 29/1201* (2013.01); *G11C 29/12015* (2013.01); *G11C 29/14* (2013.01); *G11C 29/56012* (2013.01); *G11C 2029/1208* (2013.01)

(58) Field of Classification Search
CPC ...................................................... G11C 29/46
See application file for complete search history.

(56) References Cited

U.S. PATENT DOCUMENTS

| | | | | |
|---|---|---|---|---|
| 5,394,404 A | * | 2/1995 | Uchida ............ | G01R 31/31852 324/73.1 |
| 5,467,468 A | * | 11/1995 | Koshikawa ............ | G11C 29/26 712/227 |
| 6,005,814 A | * | 12/1999 | Mulholland ..... | G01R 31/31701 365/189.05 |

(Continued)

FOREIGN PATENT DOCUMENTS

KR 101208950 B1 11/2012

*Primary Examiner* — Steve N Nguyen

(74) *Attorney, Agent, or Firm* — William Park & Associates Ltd.

(57) ABSTRACT

A test mode control circuit relating to a technology for controlling a vendor specific test mode is disclosed. The test mode control circuit includes a signal generation circuit configured to generate a plurality of set signals and a plurality of reset signals in response to a plurality of code signals and a predetermined mode register signal; and a plurality of serially-connected latch circuits configured to selectively operate in response to the plurality of set signals and the plurality of reset signals so as to control an entry signal of an output terminal.

10 Claims, 11 Drawing Sheets

(56) References Cited

U.S. PATENT DOCUMENTS

| | | | |
|---|---|---|---|
| 6,256,240 B1 * | 7/2001 | Shinozaki | G11C 29/46 365/201 |
| 6,512,709 B1 | 1/2003 | Nakahara et al. | |
| 2001/0017552 A1 * | 8/2001 | Tsuboi | G01R 31/31701 324/750.3 |
| 2002/0176297 A1 * | 11/2002 | Makabe | G11C 29/46 365/201 |
| 2008/0278189 A1 * | 11/2008 | Hur | G01R 31/31701 324/750.3 |
| 2009/0070061 A1 | 3/2009 | Cha | |

* cited by examiner

TEST MODE CONTROL CIRCUIT

CROSS-REFERENCE TO RELATED APPLICATION

This application is a divisional application for application U.S. Ser. No. 15/133,013 and claims priority based upon Korean patent application No. 10-2015-0185935, filed on Dec. 24, 2015, the disclosure of which is hereby incorporated in its entirety by reference herein.

BACKGROUND OF THE INVENTION

Embodiments of the present disclosure relate to a test mode control circuit, and more particularly to a technology for controlling a vendor specific test mode.

Generally, a register set (RS) is used to define special functions from among DDR SDRAM operations. RS may include Mode Register Sets (MRS) and Extend Mode Register Sets (EMRS).

In MRS and EMRS, a mode register setting command and special modes of the DDR SDRAM operations are established as values applied to address pins. The established MRS and the established EMRS may remain unchanged until they are re-programmed or until they are powered off.

The MRS are mainly requisite for a synchronous dynamic random access memory (DRAM) and a static random access memory (SRAM). Prior to using the chip, the mode setting is achieved, such that a burst type, a burst length (BL), column address strobe (CAS) signal latency (CL), etc. are established.

For example, the MRS select and use a test mode which involves a vendor testing the chip and a Joint Electron Device Engineering Council (JEDEC) mode where a user decides a burst type, a burst length, etc.

BRIEF SUMMARY OF THE INVENTION

In accordance with an embodiment of the present disclosure, a test mode control circuit may include a signal generation circuit configured to generate a plurality of set signals and a plurality of reset signals in response to a plurality of code signals and a predetermined mode register signal; and a plurality of serially-connected latch circuits configured to selectively operate in response to the plurality of set signals and the plurality of reset signals so as to control an entry signal of an output terminal.

In accordance with an embodiment of the present disclosure, a test mode control circuit includes: a signal generation circuit configured to generate a plurality of set signals and a plurality of reset signals in response to a selection code signal of a first group, a selection code signal of a second group, and a predetermined mode register signal; and a plurality of serially-connected latch circuits configured to selectively operate in response to the plurality of set signals and the plurality of reset signals so as to control an entry signal of an output terminal.

In accordance with an embodiment of the present disclosure, a system comprising: a semiconductor circuit configured to include a test mode control circuit; the test mode control circuit further comprising: a signal generation circuit configured to generate a plurality of set signals and a plurality of reset signals; and a plurality of serially-connected latch circuits configured to selectively operate in response to the plurality of set signals and the plurality of reset signals so as to control an entry signal of an output terminal.

BRIEF DESCRIPTION OF THE DRAWINGS

The above and other features and advantages of the present disclosure will become readily apparent by reference to the following detailed description when considered in conjunction with the accompanying drawings wherein.

DESCRIPTION OF EMBODIMENTS

Various embodiments of the present disclosure are directed to providing a test mode control circuit that substantially obviates one or more problems due to limitations and disadvantages of the related art.

The embodiments of the present disclosure relate to a technology for preventing access of an abnormal code by controlling entry of a vendor specific test mode.

Reference will now be made in detail to embodiments of the present disclosure, examples of which are illustrated in the accompanying drawings. Wherever possible, the same reference numbers are used throughout the drawings to refer to the same or like portions. In the following description of the present disclosure, a detailed description of related known configurations or functions incorporated herein may be omitted for clarity of the subject matter of the present disclosure.

Figure 1:
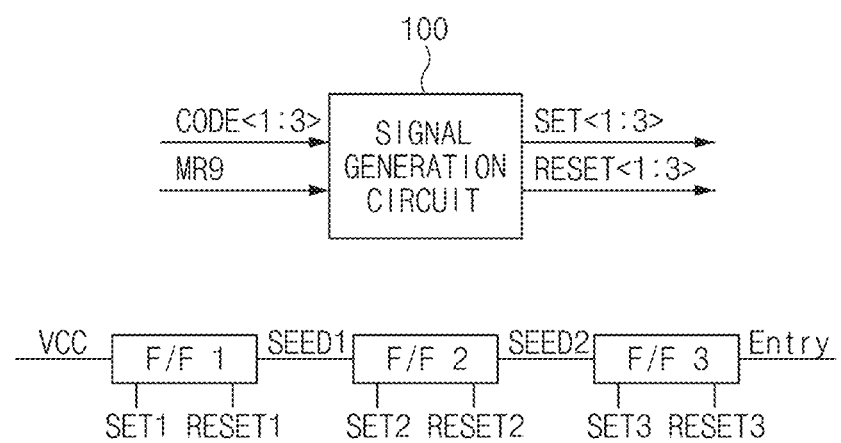
FIG. 1 is a block diagram illustrating a test mode control circuit according to an embodiment of the present disclosure.

FIG. 1 is a block diagram illustrating a test mode control circuit according to an embodiment of the present disclosure.

Referring to FIG. 1, the test mode control circuit according to the embodiment may include a latch circuit including a plurality of flip-flops (F/F1~F/F3) coupled in series to one another, and a signal generation circuit 100.

In FIG. 1, the flip-flop (F/F1) may flip-flop a power-supply voltage (VCC) in response to a set signal (SET1) and a reset signal (RESET1), thereby outputting a seed signal (SEED1). The flip-flop (F/F2) may flip-flop the seed signal (SEED1) in response to a set signal (SET2) and a reset signal (RESET2), thereby outputting a seed signal (SEED2). The flip-flop (F/F3) may flip-flop the seed signal (SEED2) in response to a set signal (SET3) and a reset signal (RESET3), thereby outputting an entry signal (Entry).

As described above, the embodiment of the present disclosure can implement a test mode entry circuit using three-stage flip-flops (F/F1~F/F3). For this purpose, the embodiment may require three set signals (SET1~SET3) and three reset signals (RESET1~RESET3).

The signal generation circuit 100 may generate a set signal SET<1:3> and a reset signal RESET<1:3> in response to a code signal CODE<1:3> and a mode register signal (MR9), and may output the set signal SET<1:3> and the reset signal RESET<1:3> to the plurality of flip-flops (F/F1~F/F3).

As described above, the respective flip-flops (F/F1~F/F3) may be independently set or reset in response to output signals of the signal generation circuit 100. That is, only one flip-flop (F/F) corresponding to the position of any of the seed signals (SEED1~SEED3), from among the flip-flops (F/F1~F/F3) may operate according to the position of the seed signals (SEED1~SEED3), and the remaining two flip-flops (F/F) may be reset and not operated.

Semiconductor circuits include a test mode to test a normal operation, before released to the market as manufactured products, such that manufacturers can recognize whether an abnormal operation or unexpected problem has occurred in the semiconductor circuits. Thereafter, only normal semiconductor circuits other than the abnormal semiconductor circuits are manufactured as products and then released to the market.

In order to perform the above-mentioned test, the semiconductor circuit enters a test mode to perform the test and monitors the test result, such that it is determined whether the semiconductor circuit operates normally. If the entry signal (Entry) indicating the output signal of the flip-flop (F/F3) is activated, the semiconductor circuit enters the test mode.

In addition, the semiconductor circuit includes various test modes according to the operations thereof. Specifically, the semiconductor circuit includes a test mode for testing a normal circuit configured to input/output data, and an other test node for testing the remaining circuits other than the normal circuit.

The test mode of the semiconductor circuit may receive a plurality of addresses from an external part. One test mode corresponding to the combination of addresses from among a plurality of test modes may be enabled such that a necessary test can be carried out.

In this case, the test mode may be performed by information stored in the Mode Register Set (MRS). A plurality of addresses received from the external part may be decoded such that the test mode can be performed. For this purpose, the semiconductor circuit includes a decoding circuit configured to decode a plurality of addresses, such that the semiconductor circuit can perform a predetermined test mode using the decoding circuit. In addition, the remaining circuits other than the normal circuit may activate the entry signal (Entry) in response to the mode register signal (MR9) needed to perform a separate test mode, such that the remaining circuits can perform the test mode.

During the vendor specific test mode of the specification, the mode register signal (MR9) (i.e., the ninth mode) from among mode register commands may be used. To prevent the user from entering the ninth mode without permission, there is a need to design the chip in a manner that the user cannot easily enter the ninth mode.

That is, if the semiconductor circuit enters the vendor specific test mode during the normal operation, the faulty operation or malfunction of the semiconductor chip may potentially occur. Therefore, as a preventative measure, the semiconductor circuit can enter the vendor specific test mode only when vendor-desired code sequences are sequentially and correctly input to the semiconductor circuit, resulting in the entry procedure becoming complicated.

The embodiment of the present disclosure implements a complicated entry process for entering the vendor specific test mode established by the mode register signal (MR9), resulting in stronger encryption.

Figure 2:
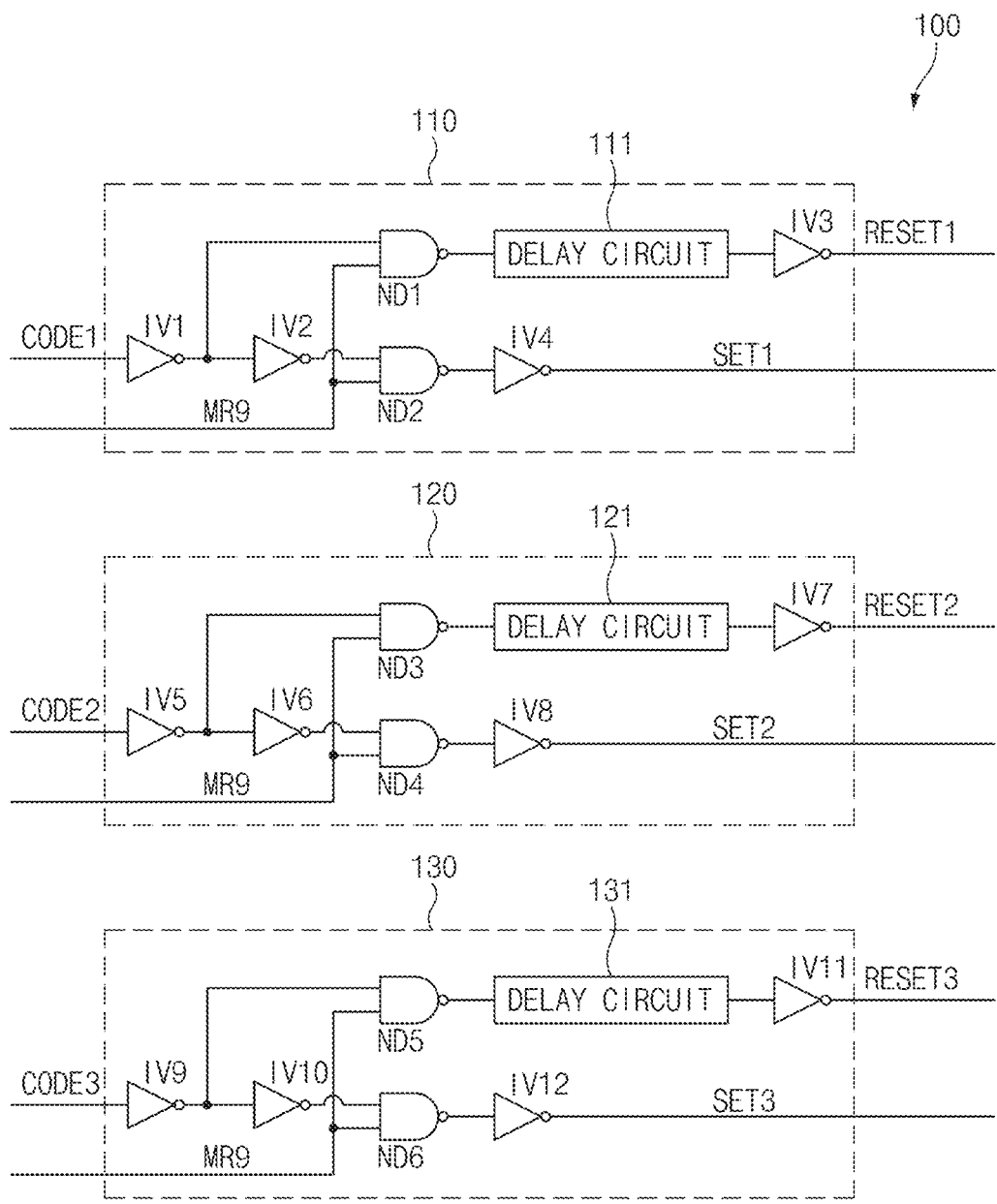
FIG. 2 is a detailed circuit diagram illustrating a signal generation circuit shown in FIG. 1.

FIG. 2 is a detailed circuit diagram illustrating the signal generation circuit 100 shown in FIG. 1.

Referring to FIG. 2, the signal generation circuit 100 may include a plurality of set/reset signal generation circuits (110~130).

For example, assuming that three code signals (CODE1~CODE3) applied to the signal generation circuit 100 are present, three flip-flops (F/F1~F/F3) are needed as shown in the embodiment of FIG. 1. In addition, the signal generation circuit 100 requires three set signals (SET1~SET3) and three reset signals (RESET1~RESET3).

Although the embodiment has exemplarily disclosed that three code signals (CODE1~CODE3) and three flip-flops (F/F1~F/F3) are present, the scope or spirit of the embodiment is not limited thereto, and the number of code signals and the number of flip-flops can also be changed to other numbers when necessary.

In this particular case, the set/reset signal generation circuit 110 may generate a set signal (SET1) and a reset signal (RESET1) in response to the code signal (CODE1) and the mode register signal (MR9). The set/reset signal generation circuit 110 may include a plurality of inverters (IV1~IV4), a plurality of NAND gates (ND1, ND2), and a delay circuit 111.

The inverters (IV1, IV2) may perform non-inversion delaying of the code signal (CODE1). The NAND gate (ND1) may perform a NAND operation between the output signal of the inverter IV1 and the mode register signal (MR9). The NAND gate (ND2) may perform a NAND operation between the output signal of the inverter IV2 and the mode register signal (MR9). The delay circuit 111 may delay the output signal of the NAND gate (ND1). The delay circuit 111 may have a delay time corresponding to the setting delay time. The inverter IV3 may output the reset signal (RESET1) by inverting the output signal of the delay circuit 111. The inverter IV4 may output the set signal (SET1) by inverting the output signal of the NAND gate (ND2).

The set/reset signal generation circuit 110 may activate the set signal (SET1) to a high level when the code signal (CODE1), and the mode register signal (MR9) are at a high level, such that the set/reset signal generation circuit 110 may output the high-level set signal (SET1). In contrast, the set/reset signal generation circuit 110 may activate the reset signal (RESET1) to a high level when the code signal (CODE1) is at a low level and the mode register signal (MR9) is at a high level, such that the set/reset signal generation circuit 110 may output the high-level reset signal (RESET1).

The flip-flop (F/F1) may output the seed signal (SEED1) to the flip-flop (F/F2) when the set signal (SET1) is activated. In contrast, the flip-flop (F/F1) may be initialized when the reset signal (RESET1) is activated.

The set/reset signal generation circuit 120 may generate the set signal (SET2) and the reset signal (RESET2) in response to the code signal (CODE2) and the mode register signal (MR9). The set/reset signal generation circuit 120 may include a plurality of inverters (IV5~IV8), a plurality of NAND gates (ND3, ND4), and a delay circuit 121.

The inverters (IV5, IV6) may perform non-inversion delaying of the code signal (CODE2). The NAND gate (ND3) may perform the NAND operation between the output signal of the inverter IV5 and the mode register signal (MR9). The NAND gate (ND4) may perform the NAND operation between the output signal of the inverter IV6 and the mode register signal (MR9). The delay circuit 121 may delay the output signal of the NAND gate (ND3). In this case, the delay circuit 121 may have a delay time corresponding to the setting delay time. The inverter IV7 may output the reset signal (RESET2) by inverting the output signal of the delay circuit 121. The inverter IV8 may output the set signal (SET2) by inverting the output signal of the NAND gate (ND4).

The set/reset signal generation circuit 120 may activate the set signal (SET2) to a high level when the code signal (CODE2) and the mode register signal (MR9) are at a high level, such that the set/reset signal generation circuit 120 may output the high-level set signal (SET2). In contrast, the set/reset signal generation circuit 120 may activate the reset signal (RESET2) to a high level when the code signal (CODE2) is at a low level and the mode register signal (MR9) is at a high level, such that the set/reset signal generation circuit 120 may output the high-level reset signal (RESET2).

The flip-flop (F/F2) may output the seed signal (SEED2) to the flip-flop (F/F3) when the set signal (SET2) is activated. In contrast, the flip-flop (F/F2) may be initialized when the reset signal (RESET2) is activated.

In addition, the set/reset signal generation circuit 130 may generate the set signal (SET3) and the reset signal (RESET3) in response to the code signal (CODE3) and the mode register signal (MR9). The set/reset signal generation circuit 130 may include a plurality of inverters (IV9~IV12), a plurality of NAND gates (ND5, ND6), and a delay circuit 131.

The inverters (IV9, IV10) may perform non-inversion delaying of the code signal (CODE3). The NAND gate (ND5) may perform the NAND operation between the output signal of the inverter IV9 and the mode register signal (MR9). The NAND gate (ND6) may perform the NAND operation between the output signal of the inverter IV10 and the mode register signal (MR9). The delay circuit 131 may delay the output signal of the NAND gate (ND5). In this case, the delay circuit 131 may have a delay time corresponding to the setting delay time. The inverter IV11 may output the reset signal (RESET3) by inverting the output signal of the delay circuit 131. The inverter IV12 may output the set signal (SET3) by inverting the output signal of the NAND gate (ND6).

The set/reset signal generation circuit 130 may activate the set signal (SET3) to a high level when the code signal (CODE3) and the mode register signal (MR9) are at a high level, such that the set/reset signal generation circuit 130 may output the high-level set signal (SET3). In contrast, the set/reset signal generation circuit 130 may activate the reset signal (RESET3) to a high level when the code signal (CODE3) is at a low level and the mode register signal (MR9) is at a high level, such that the set/reset signal generation circuit 130 may output the high-level reset signal (RESET3).

The flip-flop (F/F3) may activate the entry signal (Entry) when the set signal (SET3) is activated, and thus enter the test mode. In contrast, the flip-flop (F/F3) may be initialized when the reset signal (RESET3) is activated.

As described above, the set signals (SET1~SET3) may be controlled by an AND operation of the mode register signal (MR9) and the code signals (CODE1~CODE3). In contrast, the reset signals (RESET1~RESET3) may be controlled by an AND operation of the mode register signal (MR9) and inverted signals of the code signals (CODE1~CODE3).

Thereafter, after the set signals (SET1~SET3) are activated and then respectively delayed by the setting delay times of the delay circuits (111, 121, 131), the reset signals (RESET1~RESET3) may be activated. Since three code signals (CODE1~CODE3) are sequentially input to the signal generation circuit 100, the three reset signals (RESET1~RESET3) may be activated when any erroneous or wrong signal is applied to the signal generation circuit 100, such that all the flip-flops (F/F1~F/F3) are reset.

The code signals (CODE1~CODE3) are sequentially applied to the signal generation circuit 100. Each flip-flop (F/F1~F/F3) may be configured to transmit the seed signal (SEED) to a latch corresponding to a next code.

Thereafter, assuming that the next code is accurately applied to the signal generation circuit 100, the seed signal (SEED) is applied to another latch located subsequent to the next code. In this case, latches of other flip-flops (F/F) are reset and then controlled while the seed signal (SEED) is applied to the subsequent flip-flop (F/F).

The signal applied to each flip-flop (F/F) through the seed signal (SEED) may be stored in the latch by the set signal (SET). The flip-flops (F/F) may also be reset by the reset signal (RESET). In order to store the code signal (CODE) in the latch according to the set signal (SET) before each flip-flop (F/F) is reset by the reset signal (RESET), a predetermined setting delay time is needed, and the corresponding delay time is established by the delay circuits (111, 121, 131). That is, the code signal applied to the latch may be determined during the setting delay time established in the delay circuits (111, 121, 131).

If the order of the input code signals is wrong or if the corresponding input code signal is not identical to a predetermined code signal, the latches of the flip-flops (F/F) are reset such that the entire entry circuit can be reset and controlled.

Figure 3:
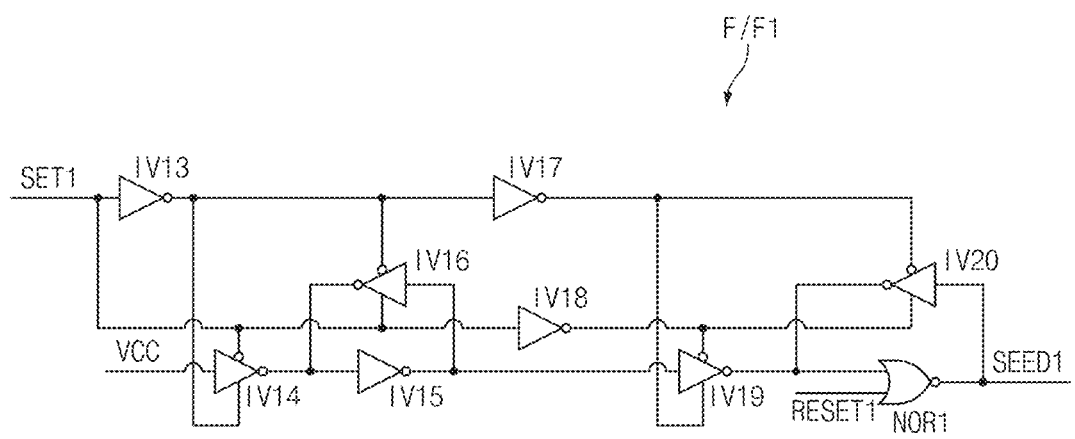
FIG. 3 is a detailed circuit diagram illustrating a flip-flop shown in FIG. 1.

FIG. 3 is a detailed circuit diagram illustrating the flip-flop (F/F1) shown in FIG. 1.

Since the detailed circuit diagrams of the flip-flops (F/F1~F/F3) shown in FIG. 1 are identical to each other, the embodiment shown in FIG. 3 will hereinafter be described using the detailed circuit diagram of the first flip-flop (F/F1) shown in FIG. 1 as an example for convenience of description and better understanding of the present disclosure.

The flip-flop (F/F1) may include a plurality of inverters (IV13~IV20) and a NOR gate (NOR1). The inverters (IV14, IV16, IV19, IV20) from among the plurality of inverters (IV13~IV20) may be implemented as three-state inverters.

The inverter IV13 may invert the set signal (SET1). The inverter IV14 may invert a high-level power-supply voltage (VCC) according to a control signal of the set signal (SET1). The inverter IV15 may invert the output signal of the inverter IV14. The inverter IV16 may invert the output signal of the inverter IV15 in response to the output signal of the inverter IV13. In this case, the inverter IV16 may be coupled to the inverter IV15 through a latch structure.

In addition, the inverter IV17 may invert the output signal of the inverter IV13. The inverter IV18 may invert the set signal (SET1). The inverter IV19 may invert the output signal of the inverter IV15 in response to the output signal of the inverter IV18. The inverter IV20 may invert the seed signal (SEED1) in response to the output signal of the inverter IV17. The NOR gate (NOR1) may output the seed signal (SEED1) by performing a NOR operation between the output signal of the inverter IV19 and the reset signal (RESET1). In this case, the inverter IV20 may be coupled to the NOR gate (NOR1) through a latch structure.

The above-mentioned flip-flop (F/F1) may receive a previous signal before receiving the set signal (SET1). Thereafter, if the set signal (SET1) is input to the flip-flop (F/F1), the flip-flop (F/F1) may latch the set signal (SET1) with the latch structure including the inverters IV15 and IV16. In addition, the latch, including the inverter IV20 and the NOR gate NOR1, may store the output signal of the latch structure, including the inverters IV15 and IV16, therein.

If the set signal (SET1) is activated to a high level, the flip-flop (F/F1) may flip-flop the seed signal (SEED1) and thus output a high-level signal. In addition, assuming that the seed signal (SEED1) is applied to the next-stage flip-flop (F/F2), the flip-flop (F/F1) may activate the reset signal (RESET1) to a high level, such that the seed signal (SEED1) is initialized to a low level.

Figure 4:
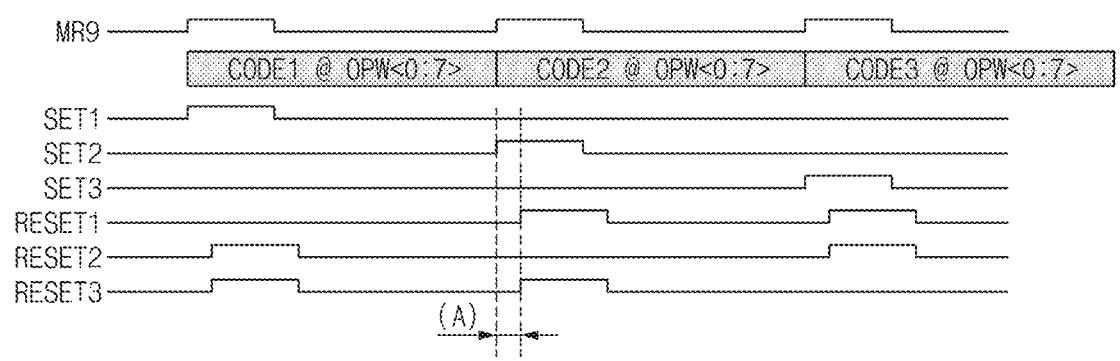
FIG. 4 is a timing diagram illustrating the operations of the test mode control circuit shown in FIG. 1.

FIG. 4 is a timing diagram illustrating the operations of the test mode control circuit shown in FIG. 1.

Referring to FIG. 4, three code signals (CODE1, CODE2, CODE3) are sequentially activated at a specific time at which the mode register signal (MR9) is activated to a high level. In this case, the code signal (CODE<1:3>) may be generated by a combination of the code signals <0:7>. The code signal OPW<0:7> may be received from the mode register set (MRS) or the external part, so that the test mode can start operation.

If the mode register signal (MR9) corresponding to the code signal (CODE1) is activated to a high level, the set signal (SET1) is activated. Thereafter, the first flip-flop (F/F1) may be configured to transmit the seed signal (SEED1). In this case, the reset signal (RESET1) is at a low level such that the flip-flop (F/F1) starts operation. In contrast, the remaining reset signals (RESET2, RESET3) may transition to a high level such that the flip-flops (F/F2, F/F3) are reset.

Thereafter, if the mode register signal (MR9) corresponding to the code signal (CODE2) is activated to a high level, the set signal (SET2) is activated. Thereafter, the second flip-flop (F/F2) may be configured to transmit the seed signal (SEED2). In this case, the reset signal (RESET2) is at a low level such that the flip-flop (F/F2) starts operation. In contrast, the remaining reset signals (RESET1, RESET3) may transition to a high level such that the flip-flops (F/F1, F/F3) are reset.

In this case, there may be a set period of time after completion of the enabled set signal (SET2) and before the reset signals (RESET1, RESET3) are enabled. The set period of time may be the setting delay time corresponding to a predetermined time (A). The setting delay time corresponding to the time (A) may correspond to the delay time of the delay circuit 121 of the set/reset signal generation circuit 120.

Assuming that a time difference between the set time and the reset time is used, the flip-flops (F/F) can sequentially transmit the seed signals (SEED1~SEED3). And while the flip-flops (F/F) sequentially transmit the seed signals (SEED1~SEED3), the remaining flip-flops other than the flip-flop (F/F) transmitting the seed signal may be reset. For example, when the flip-flops (F/F) are sequentially transmitting the seed signals (SEED1~SEED3), the first flip-flop (F/F 1) may be the first to transmit a seed signal (SEED1) while the second flip-flop (F/F 2) and third flip-flop (F/F 3) are reset. Then, the second flip-flop may transmit a seed signal (SEED2) while the first flip-flop (F/F 1) and the third flip-flop (F/F 3) are reset. Finally, the third flip-flop may transmit a seed signal (SEED3) while the first flip-flop (F/F 1) and the second flip-flop (F/F 2) are reset. During this time difference, there is a need to guarantee a predetermined time in which the code signal is transmitted to and stored in latches of the flip-flop (F/F). The predetermined time may be established as the setting delay time corresponding to the time (A).

Subsequently, assuming that the mode register signal (MR9) corresponding to the code signal (CODE3) is activated to a high level, the set signal (SET3) is activated. Thereafter, the third flip-flop (F/F3) may activate the entry signal (Entry) and output the activated entry signal (Entry). In this case, the reset signal (RESET3) is at a low level, such that the flip-flop (F/F3) starts operation. In contrast, the remaining reset signals (RESET1, RESET2) may transition to a high level such that the flip-flops (F/F1, F/F2) are reset.

Figure 5:
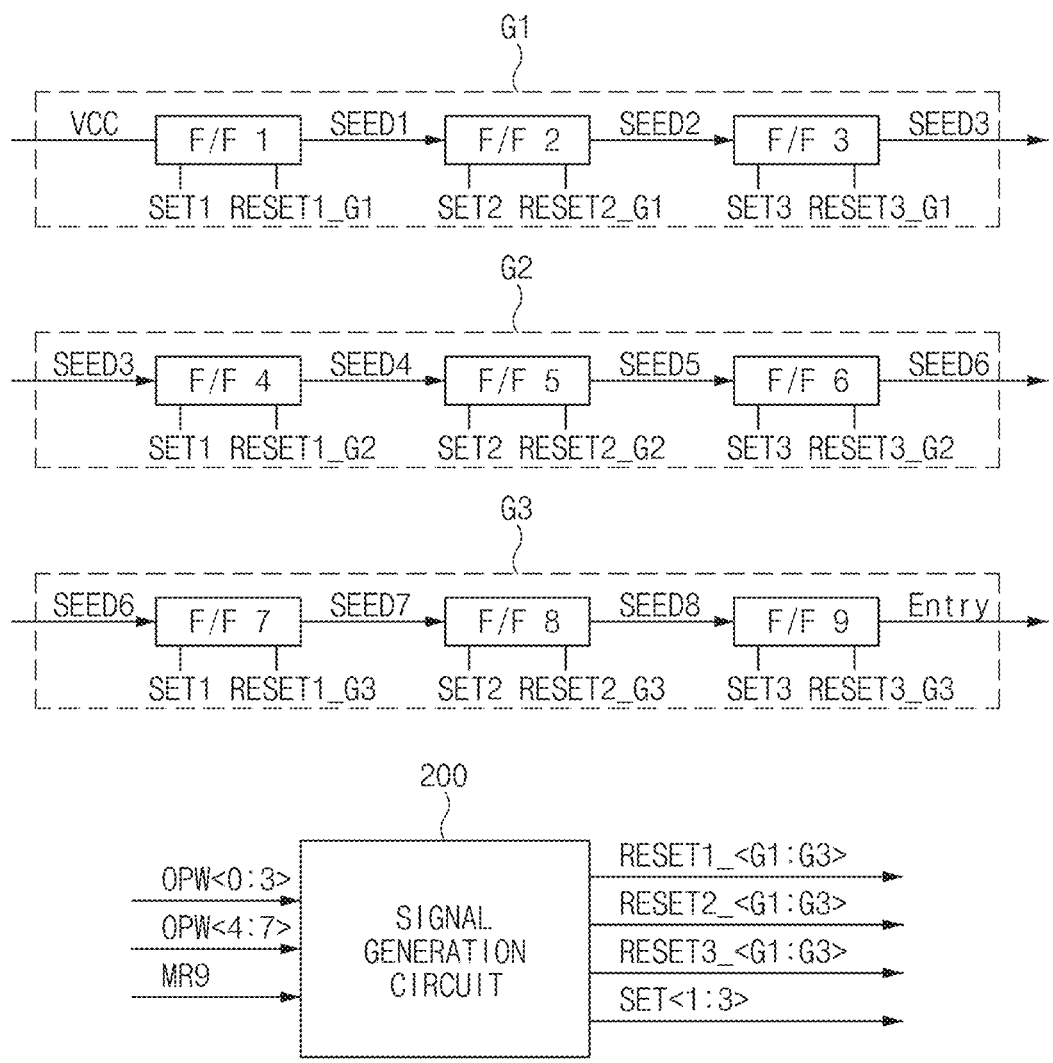
FIG. 5 is a circuit diagram illustrating a test mode control circuit according to another embodiment of the present disclosure.

FIG. 5 is a circuit diagram illustrating a test mode control circuit according to another embodiment of the present disclosure.

Referring to FIG. 5, the test mode control circuit according to the embodiment may include a plurality of groups (G1~G3) and a signal generation circuit 200. In this case, the first group G1 may include a plurality of latch circuits (i.e., flip-flops F/F1~F/F3) coupled in series to one another. The second group G2 may include a plurality of latch circuits (i.e., flip-flops F/F4~F/F6) coupled in series to one another. In addition, the third group G3 may include a plurality of latch circuits (i.e., flip-flops F/F7~F/F9) coupled in series to one another.

In accordance with the embodiment, three groups (G1~G3) may be used and each group may include three flip-flops (F/F) for convenience of description and better understanding of the present disclosure. That is, according to the embodiment, the nine-stage entry circuit is implemented by 9 flip-flops (F/F) coupled in series to one another and the entry process becomes more complicated in design. However, the scope or spirit of the embodiment of the present disclosure is not limited thereto, and the number of groups and the number of flip-flops may also be changed as necessary.

The flip-flop (F/F1) of the first group G1 may flip-flop the power-supply voltage (VCC) in response to the set signal (SET1) and the reset signal (RESET1_G1), and output the seed signal (SEED1). The flip-flop (F/F2) may flip-flop the seed signal (SEED1) in response to the set signal (SET2) and the reset signal (RESET2_G1), and output the seed signal (SEED2). In addition, the flip-flop (F/F3) may flip-flop the seed signal (SEED2) in response to the set signal (SET3) and the reset signal (RESET3_G1), and output the seed signal (SEED3) to the group G2.

The flip-flop (F/F4) of the second group G2 may flip-flop the seed signal (SEED3) in response to the set signal (SET1) and the reset signal (RESET1_G2), and output the seed signal (SEED4). The flip-flop (F/F5) may flip-flop the seed signal (SEED4) in response to the set signal (SET2) and the reset signal (RESET2_G2), and output the seed signal (SEED5). In addition, the flip-flop (F/F6) may flip-flop the seed signal (SEED5) in response to the set signal (SET3) and the reset signal (RESET3_G2), and output the seed signal (SEED6) to the group G3.

The flip-flop (F/F7) of the third group G3 may flip-flop the seed signal (SEED6) in response to the set signal (SET1) and the reset signal (RESET1_G3), and output the seed signal (SEED7). The flip-flop (F/F8) may flip-flop the seed signal (SEED7) in response to the set signal (SET2) and the reset signal (RESET2_G3), and output the seed signal (SEED8). In addition, the flip-flop (F/F9) may flip-flop the seed signal (SEED8) in response to the set signal (SET3) and the reset signal (RESET3_G3), and output the entry signal (Entry).

During the vendor specific test mode on the specification, the selection code signal OPW<0:7> from among mode register commands may be used. The signal generation circuit 200 may generate the set signal (SET<1:3>) and the reset signals (RESET1_<G1:G3>, RESET2_<G1:G3>, RESET3_<G1:G3>) in response to the selection code signal OPW<0:3>, the selection code signal OPW<4:7> and the mode register signal (MR9), the signal generation circuit 200 may output the generated set signal (SET<1:3>) and the generated reset signals (RESET1_<G1:G3>, RESET2_<G1: G3>, RESET3_<G1:G3>) to the respective groups (G1~G3).

For example, according to the embodiment of the present disclosure, the selection code signals OPW<0:7> composed of 8 bits may be grouped. That is, the selection code signals OPW<0:3> corresponding to 4 lower bits from among the plurality of selection code signals OPW<0:7> may be grouped such that any one of the plurality of groups (G1~G3) can be selected using the grouped result. The selection code signals OPW<4:7> composed of 4 upper bits from among the plurality of selection code signals OPW<0: 7> are grouped such that each code signal can be received from the selected group based on the grouped result.

Figure 6:
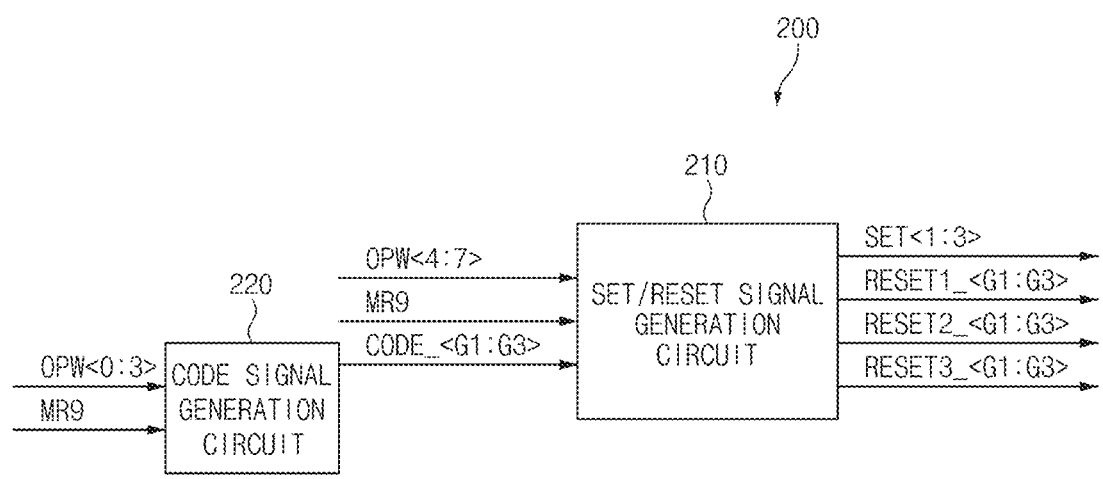
FIG. 6 is a detailed circuit diagram illustrating a signal generation circuit shown in FIG. 5.

FIG. 6 is a detailed circuit diagram illustrating the signal generation circuit 200 shown in FIG. 5.

Referring to FIG. 6, the signal generation circuit 200 may include a set/reset signal generation circuit 210 and a code signal generator 220.

The set/reset signal generation circuit 210 may generate the set signal (SET<1:3>) and the reset signals (RESET1_<G1:G3>, RESET2_<G1:G3>, RESET3_<G1: G3>) in response to the selection code signal OPW<4:7>, the mode register signal (MR9), and the code signal (CODE_<G1:G3>).

The code signal generator 220 may output the code signal CODE_<G1:G3> to the set/reset signal generation circuit 210 in response to the selection code signal OPW<0:3> and the mode register signal (MR9).

Figure 7:
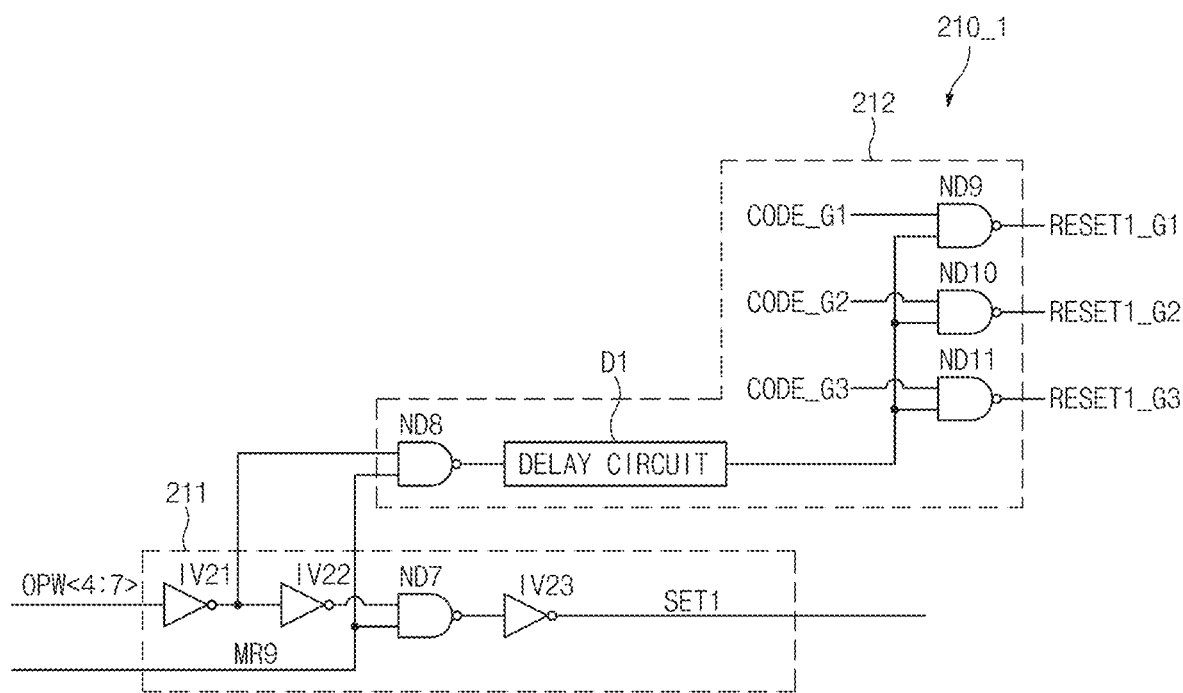
FIGS. 7 to 9 are detailed circuit diagrams illustrating a set/reset signal generation circuit shown in FIG. 6.
Figure 8:
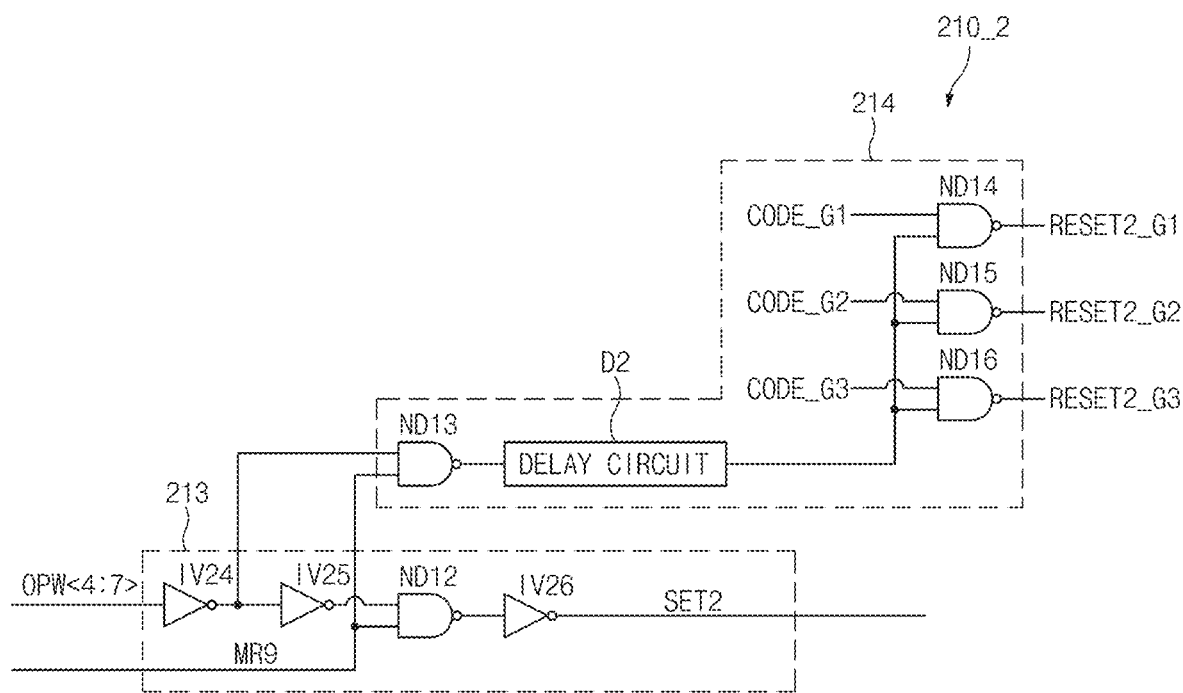
Figure 9:
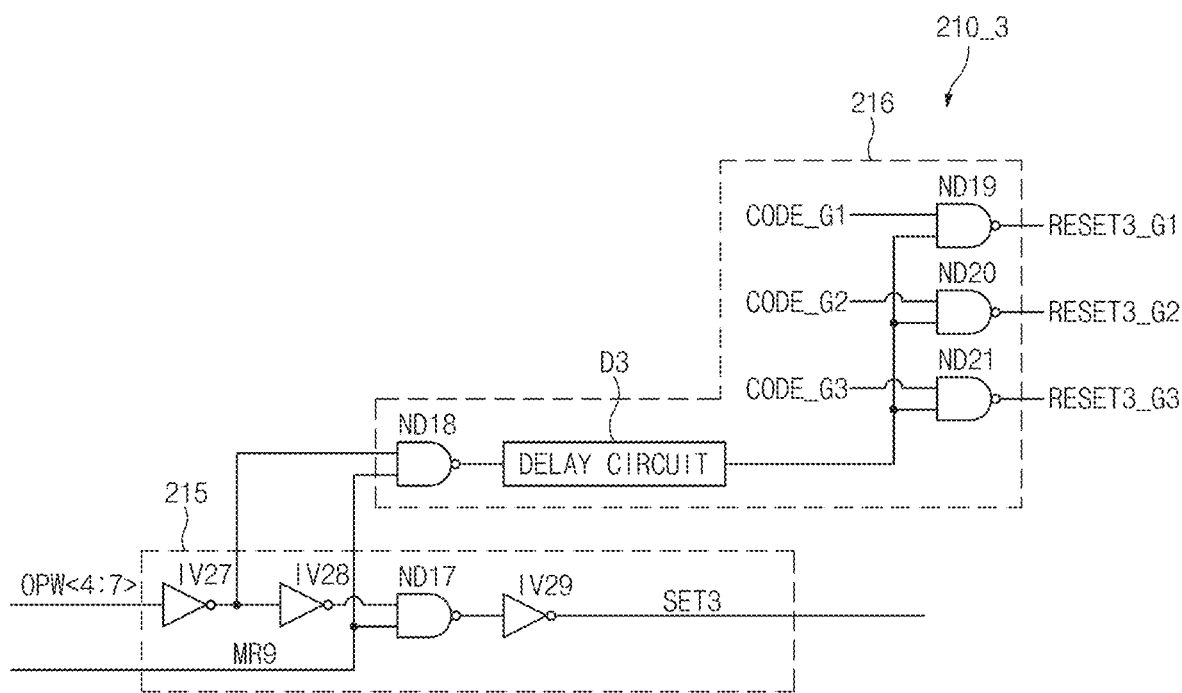

FIGS. 7 to 9 are detailed circuit diagrams illustrating the set/reset signal generation circuit 210 shown in FIG. 6.

Referring to FIG. 7, the set/reset signal generation circuit (210_1) may include a set signal generator 211 and a reset signal generator 212.

In this case, the set signal generator 211 may generate the set signal (SET1) by combining the selection code signal OPW<4:7> and the mode register signal (MR9). The set signal generator 211 may activate the set signal (SET1) to a high level when the selection code signal OPW<4:7> is at a high level and the mode register signal (MR9) is at a high level, thereby outputting the high-level set signal (SET1).

For this purpose, the set signal generator 211 may include a plurality of inverters (IV21~IV23) and a NAND gate (ND7). The inverters (IV21, IV22) may perform non-inversion delaying of the selection code signal OPW<4:7>. The NAND gate (ND7) may perform the NAND operation between the output signal of the inverter IV22 and the mode register signal (MR9). The inverter IV23 may invert the output signal of the NAND gate (ND7), and then output the set signal (SET1).

The reset signal generator 212 may combine the selection code signal OPW<4:7> inverted by the inverter IV21, the mode register signal (MR9), and the group code signal (CODE_<G1:G3>), and may generate the reset signal (RESET1_<G1:G3>) according to the combination of results.

If the high-level group code signal (CODE_<G1:G3>) is input to the reset signal generator 212 when the selection code signal OPW<4:7> is at a high level and the mode register signal (MR9) is at a high level, the reset signal generator 212 may output the reset signal (RESET1_<G1: G3>) at a low level.

However, if the group code signal (CODE_<G1:G3>) is at a low level, the reset signal generator 212 may output the corresponding reset signal (RESET1_<G1:G3>) at a high level. As a result, the flip-flops (F/F1, F/F4, F/F7) of the corresponding groups (G1~G3) may be reset and initialized.

For this purpose, the reset signal generator 212 may include a plurality of NAND gates (ND8~ND11) and a delay circuit D1. The NAND gate (ND8) may perform the NAND operation between the output signal of the inverter IV21 and the mode register signal (MR9). The delay circuit D1 may delay the output signal of the NAND gate (ND8). In this case, the delay time of the delay circuit D1 may be established as the setting delay time.

The NAND gate (ND9) may output the reset signal (RESET1_G1) by performing the NAND operation between the group code signal (CODE_G1) and the output signal of the delay circuit D1. Similarly, the NAND gate (ND10) may output the reset signal (RESET1_G2) by performing the NAND operation between the group code signal (CO-DE_G2) and the output signal of the delay circuit D1. In addition, the NAND gate (ND11) may output the reset signal (RESET1_G3) by performing the NAND operation between the group code signal (CODE_G3) and the output signal of the delay circuit D1.

Referring to FIG. 8, the set/reset signal generation circuit (210_2) may include a set signal generator 213 and a reset signal generator 214.

In this case, the set signal generator 213 may generate the set signal (SET3) by combining the selection code signal OPW<4:7> and the mode register signal (MR9). The set signal generator 213 may activate the set signal (SET2) to a high level when the selection code signal OPW<4:7> is at a high level and the mode register signal (MR9) is at a high level, thereby outputting the high-level set signal (SET2).

For this purpose, the set signal generator 213 may include a plurality of inverters (IV24~IV26) and a NAND gate (ND12). The inverters (IV24, IV25) may perform non-inversion delaying of the selection code signal OPW<4:7>. The NAND gate (ND12) may perform the NAND operation between the output signal of the inverter IV25 and the mode register signal (MR9). The inverter IV26 may invert the output signal of the NAND gate (ND12), and then output the set signal (SET2).

The reset signal generator 214 may combine the selection code signal OPW<4:7> inverted by the inverter IV24, the mode register signal (MR9), and the group code signal (CODE_<G1:G3>), and may generate the reset signal (RESET2_<G1:G3>) according to the combination of results.

If the high-level group code signal (CODE_<G1:G3>) is input to the reset signal generator 214 when the selection code signal OPW<4:7> is at a high level and the mode register signal (MR9) is at a high level, the reset signal generator 214 may output the reset signal (RESET2_<G1: G3>) at a low level.

However, if the group code signal CODE_<G1:G3> is at a low level, the reset signal generator 214 may output the corresponding reset signal (RESET2_<G1:G3>) at a high level. As a result, the flip-flops (F/F2, F/F5, F/F8) of the corresponding groups (G1~G3) may be reset and initialized.

For this purpose, the reset signal generator 214 may include a plurality of NAND gates (ND3~ND16) and a delay circuit D2. The NAND gate (ND13) may perform the NAND operation between the output signal of the inverter IV24 and the mode register signal (MR9). The delay circuit D2 may delay the output signal of the NAND gate (ND13). In this case, the delay time of the delay circuit D2 may be established as the setting delay time.

The NAND gate (ND14) may output the reset signal (RESET2_G1) by performing the NAND operation between the group code signal (CODE_G1) and the output signal of the delay circuit D2. Similarly, the NAND gate (ND15) may output the reset signal (RESET1_G2) by performing the NAND operation between the group code signal (CODE_G2) and the output signal of the delay circuit D2. In addition, the NAND gate (ND16) may output the reset signal (RESET2_G3) by performing the NAND operation between the group code signal (CODE_G3) and the output signal of the delay circuit D2.

Referring to FIG. 9, the set/reset signal generation circuit (210_3) may include a set signal generator 215 and a reset signal generator 216.

In this case, the set signal generator 215 may generate the set signal (SET3) by combining the selection code signal OPW<4:7> and the mode register signal (MR9). The set signal generator 215 may activate the set signal (SET3) to a high level when the selection code signal OPW<4:7> is at a high level and the mode register signal (MR9) is at a high level, and thereby outputting the high-level set signal (SET3).

For this purpose, the set signal generator 216 may include a plurality of inverters (IV27~IV29) and a NAND gate (ND17). The inverters (IV27, IV28) may perform non-inversion delaying of the selection code signal OPW<4:7>. The NAND gate (ND17) may perform the NAND operation between the output signal of the inverter IV28 and the mode register signal (MR9). The inverter IV29 may invert the output signal of the NAND gate (ND17), and then output the set signal (SET3).

The reset signal generator 216 may combine the selection code signal OPW<4:7> inverted by the inverter IV27, the mode register signal (MR9), and the group code signal (CODE_<G1:G3>), and may generate the reset signal (RESET3_<G1:G3>) according to the combination of results.

If the high-level group code signal (CODE_<G1:G3>) is input to the reset signal generator 216 when the selection code signal OPW<4:7> is at a high level and the mode register signal (MR9) is at a high level, the reset signal generator 216 may output the reset signal (RESET3_<G1:G3>) at a low level.

However, if the group code signal CODE_<G1:G3> is at a low level, the reset signal generator 216 may output the corresponding reset signal (RESET3_<G1:G3>) at a high level. As a result, the flip-flops (F/F3, F/F6, F/F9) of the corresponding groups (G1~G3) may be reset and initialized.

For this purpose, the reset signal generator 216 may include a plurality of NAND gates (ND18~ND21) and a delay circuit D3. The NAND gate (ND18) may perform the NAND operation between the output signal of the inverter IV27 and the mode register signal (MR9). The delay circuit D3 may delay the output signal of the NAND gate (ND18). In this case, the delay time of the delay circuit D3 may be established as the setting delay time.

The NAND gate (ND19) may output the reset signal (RESET3_G1) by performing the NAND operation between the group code signal (CODE_G1) and the output signal of the delay circuit D3. Similarly, the NAND gate (ND20) may output the reset signal (RESET3_G2) by performing the NAND operation between the group code signal (CODE_G2) and the output signal of the delay circuit D3. In addition, the NAND gate (ND21) may output the reset signal (RESET3_G3) by performing the NAND operation between the group code signal (CODE_G3) and the output signal of the delay circuit D3.

Figure 10:
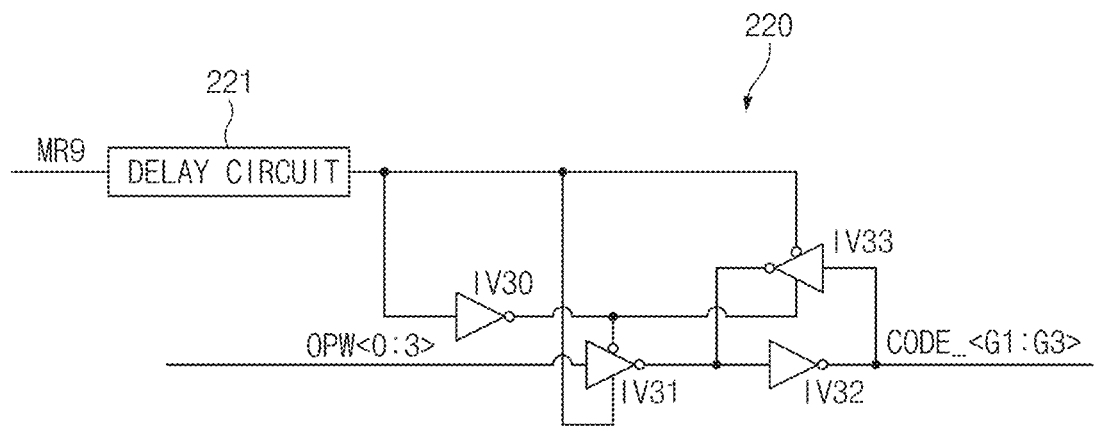
FIG. 10 is a detailed circuit diagram illustrating a code signal generation circuit shown in FIG. 6.

FIG. 10 is a detailed circuit diagram illustrating the code signal generation circuit 220 shown in FIG. 6.

Referring to FIG. 10, the code signal generation circuit 220 may latch the selection code signal OPW<0:3> in response to the mode register signal (MR9), thereby outputting the code signal CODE_<G1:G3> to the set/reset signal generation circuit 210.

The code signal generation circuit 220 may include a delay circuit 221 and a plurality of inverters (IV30~IV33). The inverters (IV31, IV33) from among the plurality of inverters (IV30~IV33) may be implemented as three-stage inverters.

The delay circuit 221 may delay the mode register signal (MR9), and may output the delayed mode register signal (MR9) to the inverters (IV30, IV33). The inverter IV30 may invert the output signal of the delay circuit 221. The inverter IV31 may invert the selection code signal OPW<0:3> in response to the output signal of the inverter IV30. In addition, the inverter IV32 may output the code signal CODE_<G1:G3> by inverting the output signal of the inverter IV31. In addition, the inverter IV33 may inversion-drive the code signal CODE_<G1:G3> in response to the output signal of the delay circuit 221.

Figure 11:
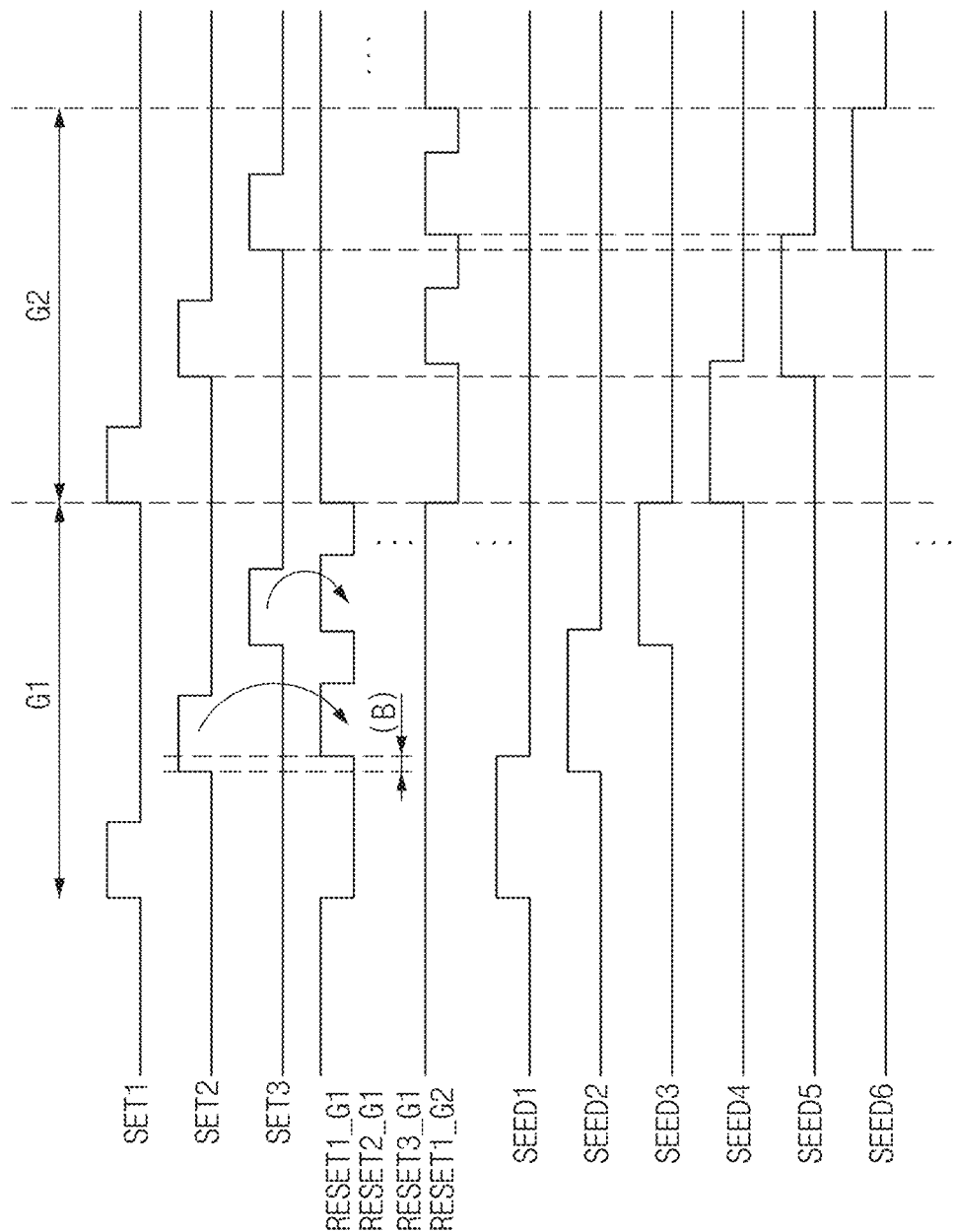
FIG. 11 is a timing diagram illustrating the operations of the test mode control circuit shown in FIG. 5.

FIG. 11 is a timing diagram illustrating the operations of the test mode control circuit shown in FIG. 5.

Referring to FIG. 11, assuming that the mode register signal (MR9) is activated to a high level, the group G1 may be selected by the selection code signal OPW<0:3>. The set signals (SET1, SET2, SET3) may be sequentially activated by the selection code signal OPW<4:7>. If the group G1 is selected, the reset signal (RESET1_G2) of the group G2 remains high in level.

In this case, if the first set signal (SET1) is activated to a high level, the reset signal (RESET1_G1) of the group G1 is at a low level. Therefore, the flip-flop (F/F1) of the group G1 starts operation, and activates the seed signal (SEED1).

Thereafter, if the second set signal (SET2) is activated to a high level, the reset signal (RESET2_G1, not shown in FIG. 11) of the group G1 is at a high level. In this case, the reset signal (RESET1_G1) of the group G1 may transition to a high level. Therefore, the flip-flop (F/F1) of the group G1 is reset, and the flip-flop F/F2 starts operation, such that the seed signal (SEED2) is activated.

Referring to FIG. 11, there may be a set period of time after the set signal (SET2) is activated (or enabled) to a high level and before the reset signal (RESET1_G1) transitions to a high level. The set period of time, a predetermined delay time for the next latch operation, may be needed during a predetermined time (B).

Assuming that a time difference between the set time and the reset time is used, the flip-flops (F/F) of the groups (G1~G3) can sequentially transmit the seed signals (SEED1~SEED8). And while the flip-flops (F/F) sequentially transmit the seed signals (SEED1~SEED3), the remaining flip-flops other than the flip-flop (F/F) transmitting the seed signal can be reset. During this time difference, there is a need to guarantee a predetermined time in which the code signal is transmitted to and stored in latches of the flip-flop (F/F). The predetermined time may be established as the setting delay time corresponding to the time (B). The setting delay times may be established in the delay circuits (D1~D3), respectively.

Subsequently, assuming that the third set signal (SET3) is activated to a high level, the reset signal (RESET3_G1, not shown in FIG. 11) of the group G1 is at a high level. In this case, the reset signal (RESET1_G1) of the group G1 may transition to a high level. Therefore, the flip-flop (F/F2) of the group G1 is reset, and the flip-flop (F/F3) starts operation, such that the seed signal (SEED3) is activated.

Assuming that the seed signal (SEED3) of the group G1 is applied to the first flip-flop (F/F4) of the group G2, the group selection code may be changed by the selection code signal OPW<0:3>. As a result, all the flip-flops (F/F1~F/F3) of the first group G1 may be reset by the reset signals (RESET1_G1, RESET2_G1, RESET3_G1).

In the meantime, assuming that the mode register signal (MR9) is activated to a high level, the group G2 may be selected by the selection code signal OPW<0:3>. The set signals (SET1, SET2, SET3) may be sequentially activated by the selection code signal OPW<4:7>. If the group G2 is selected, the reset signal (RESET1_G1) of the group G1 may remain high in level, as can be seen in the "G2" section of FIG. 11.

In this case, assuming that the first set signal (SET1) is activated to a high level, the reset signal (RESET1_G2) of the group G2 is at a low level. Therefore, the flip-flop (F/F4) of the group G2 starts operation so that the seed signal (SEED4) may be activated.

Thereafter, assuming that the second set signal (SET2) is activated to a high level, the reset signal (RESET2_G2) of the group G2 is at a high level. In this case, the reset signal (RESET1_G2) of the group G2 may transition to a high level. Therefore, the flip-flop (F/F4) of the group G2 is reset, and the flip-flop (F/F5) starts operation, such that the seed signal (SEED5) may be activated.

Subsequently, assuming that the third set signal (SET3) is activated to a high level, the reset signal (RESET3_G2) of the group G2 is at a high level. In this case, the reset signal (RESET1_G2) of the group G2 may transition to a high level. Therefore, the flip-flop (F/F5) of the group G2 is reset, and the flip-flop (F/F6) starts operation, such that the seed signal (SEED6) may be activated.

Assuming that the seed signal (SEED6) of the group G2 is applied to the first flip-flop (F/F7) of the group G3, the group selection code may be changed by the selection code signal OPW<0:3>. As a result, all the flip-flops (F/F4~F/F6) of the second group G2 may be reset by the reset signals (RESET1_G2, RESET2_G2, RESET3_G2).

Assuming that the progression of set signals being activated to a high level and the corresponding reset signal being at a low level continues, the entry sequence may be activated by the flip-flop (F/F9). If the order of the above operations is wrong or if the order of the groups is wrong, all the flip-flops (F/F) may be reset by the reset signal and then initialized.

As is apparent from the above description, the embodiments of the present disclosure can provide the following advantages.

First, the test mode control circuit according to the embodiments can deny access to a chip user with an abnormal code.

Second, the test mode control circuit according to the embodiments can strengthen encryption using a relatively simple circuit.

Third, the test mode control circuit according to the embodiments can access a vendor specific test mode from among the chip operations, such that operation errors can be prevented from occurring.

Those skilled in the art will appreciate that the invention may be carried out in other specific ways than those set forth herein without departing from the spirit and essential characteristics of the invention. The above embodiments are therefore to be construed in all aspects as illustrative and not restrictive. The scope of the invention should be determined by the appended claims and their legal equivalents, not by the above description. Further, all changes coming within the meaning and equivalency range of the appended claims are intended to be embraced therein. In addition, it is obvious to those skilled in the art that claims that are not explicitly cited in each other in the appended claims may be presented in combination as an embodiment of the invention or included as a new claim by a subsequent amendment after the application is filed.

Although a number of illustrative embodiments consistent with the invention have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings and the accompanying claims. In addition to variations and modifications in the component parts and/or arrangements, alternative uses will also be apparent to those skilled in the art.

What is claimed is:

1. A test mode control circuit comprising:
    a set/reset signal generation circuit configured to output a plurality of set signals and a plurality of reset signals in response to a selection code signal of a second group, a mode register signal, and a plurality of code signals;
    a code signal generation circuit configured to generate the plurality of code signals in response to the selection code signal of a first group and the mode register signal; and
    a plurality of serially-connected latch circuits configured to selectively operate in response to the plurality of set signals and the plurality of reset signals so as to control an entry signal of an output terminal.

2. The test mode control circuit according to claim 1, wherein the plurality of serially-connected latch circuits are divided into a plurality of groups of a predetermined number, and any one of the plurality of groups is selected in response to the selection code signal of the first group to be sequentially activated.

3. The test mode control circuit according to claim 2, wherein each of the plurality of groups includes:
    a plurality of flip-flops sequentially latching one or more seed signals of a previous stage in response to the plurality of set signals and the plurality of reset signals, and transmits the latched seed signal to a next stage.

4. The test mode control circuit according to claim 3, wherein the plurality of flip-flops receives a high-level power-supply voltage through a flip-flop of a first stage, outputs a seed signal to an output terminal of each stage, and outputs a specific test mode entry signal through a flip-flop of a final stage.

5. The test mode control circuit according to claim 1, wherein the plurality of set signals and the plurality of reset signals are sequentially activated by the selection code signal of the second group.

6. The test mode control circuit according to claim 1, wherein the plurality of latch circuits are configured in a manner that only a latch circuit selected by its corresponding set signal from among the plurality of set signals is activated and the remaining non-selected latch circuits are reset in response to the plurality of reset signals.

7. The test mode control circuit according to claim 1, wherein the set/reset signal generation circuit includes:
   a plurality of set signal generation circuits configured to output the plurality of set signals by performing a logical operation between the selection code signal of the second group and the mode register signal; and
   a plurality of reset signal generation circuits configured to output the plurality of reset signals by performing a logical operation between an inverted signal of the selection code signal of the second group and the mode register signal.

8. The test mode control circuit according to claim 7, wherein:
   the plurality of set signal generation circuits output the plurality of set signals by performing an AND operation between the mode register signal and the selection code signal of the second group; and
   the plurality of reset signal generation circuits output the plurality of reset signals by performing an AND operation between an inverted signal of the selection code signal of the second group and the mode register signal.

9. The test mode control circuit according to claim 8, wherein the plurality of reset signal generation circuits include:
   a delay circuit configured to activate the plurality of reset signals after lapse of a predetermined setting delay time starting from an activation time of the plurality of set signals.

10. The test mode control circuit according to claim 1, wherein the code signal generation circuit sequentially outputs the plurality of code signals in response to a specific signal obtained when the mode register signal is delayed by a predetermined setting delay time and the selection code signal of the first group.

* * * * *